United States Patent
Hirano et al.

(10) Patent No.: US 11,610,906 B2
(45) Date of Patent: Mar. 21, 2023

(54) SEMICONDUCTOR DEVICE

(71) Applicant: Tower Partners Semiconductor Co., Ltd., Toyama (JP)

(72) Inventors: Hiroshige Hirano, Nara (JP); Hiroaki Kuriyama, Toyama (JP)

(73) Assignee: Tower Partners Semiconductor Co., Ltd., Uozu (JP)

( * ) Notice: Subject to any disclaimer, the term of this patent is extended or adjusted under 35 U.S.C. 154(b) by 199 days.

(21) Appl. No.: 16/905,613

(22) Filed: Jun. 18, 2020

(65) Prior Publication Data

US 2020/0321346 A1  Oct. 8, 2020

Related U.S. Application Data

(63) Continuation of application No. PCT/JP2018/046518, filed on Dec. 18, 2018.

(30) Foreign Application Priority Data

Dec. 20, 2017  (JP) .............................. JP2017-243962

(51) Int. Cl.
  *H10B 41/35*  (2023.01)
  *H10B 41/10*  (2023.01)
  *H01L 27/11524*  (2017.01)
  *H01L 27/11519*  (2017.01)

(52) U.S. Cl.
  CPC .. *H01L 27/11524* (2013.01); *H01L 27/11519* (2013.01)

(58) Field of Classification Search
  CPC ......... H01L 27/11519; H01L 29/42328; H01L 27/1157; H01L 27/11524; H01L 27/11529
  See application file for complete search history.

(56) References Cited

U.S. PATENT DOCUMENTS

| | | | |
|---|---|---|---|
| 5,274,588 A | * | 12/1993 | Manzur ............... H01L 29/7885 365/185.26 |
| 5,406,514 A | | 4/1995 | Yoneda |
| 5,432,737 A | | 7/1995 | Yoneda |
| 5,432,740 A | | 7/1995 | D'Arrigo et al. |
| 5,557,569 A | | 9/1996 | Smayling et al. |
| 6,711,064 B2 | | 3/2004 | Hsu et al. |
| 2003/0235082 A1 | | 12/2003 | Hsu et al. |
| 2017/0207228 A1 | | 7/2017 | Chen et al. |

FOREIGN PATENT DOCUMENTS

| | | |
|---|---|---|
| JP | H05-174583 A | 7/1993 |
| JP | H06-169091 A | 6/1994 |
| JP | 2003-332475 A | 11/2003 |
| JP | 2006-128707 A | 5/2006 |

\* cited by examiner

*Primary Examiner* — Amar Movva
(74) *Attorney, Agent, or Firm* — Knobbe, Martens, Olson & Bear, LLP

(57) ABSTRACT

First and second memory cells are arranged on a semiconductor substrate. The memory cell includes, between a first or second source region and a first or second drain, a configuration in which a first or second selection gate and a first or second floating gate are arranged in series. The first memory cell and the second memory cell are adjacent to each other in a first direction. A first signal line extending in the first direction and connected to the first and second selection gates is further provided. The first and second source regions are configured to share a first region. The first selection gate extends in a direction different from the first direction.

8 Claims, 12 Drawing Sheets

SEMICONDUCTOR DEVICE

CROSS-REFERENCE TO RELATED APPLICATIONS

This is a continuation of International Application No. PCT/JP2018/046518 filed on Dec. 18, 2018, which claims priority to Japanese Patent Application No. 2017-243962 filed on Dec. 20, 2017. The entire disclosures of these applications are incorporated by reference herein.

BACKGROUND

A semiconductor memory device has become more general for use in various electronic devices. For example, a non-volatile memory (NVM) is widely used for mobile equipment etc.

Generally, the NVM is categorized into a re-writable (multi-time programmable: MTP) memory and a one-time-only rewritable (one-time programmable: OTP) memory. For the MTP memory, reading can be performed multiple times, and writing can be also performed multiple times. Deletion operation is not necessary in the OTP memory, but a deletion region for deletion operation is necessary in the MTP memory (e.g., US Patent Application Publication No. 2017/0207228).

Although there are types of NVM, a single-polysilicon-layer NVM realizing reduction of an additional manufacturing step has been proposed as one of these types. In the single-polysilicon-layer NVM, a charge accumulation floating gate having a single polysilicon layer is formed. The single-polysilicon-layer NVM is compatible with a normal CMOS process, and therefore, is applied as a memory (an embedded memory) incorporated into, e.g., a microcontroller (e.g., U.S. Pat. No. 6,711,064).

SUMMARY

In US Patent Application Publication No. 2017/0207228, FIG. 7B illustrate, as an example of the MTP memory, two memory cell regions arranged in the direction of a word line WL. In this example, floating gates 110a, 114a and a selection gate are formed to extend in the same direction as the word line WL. Further, in two memory cell regions adjacent to each other in the direction of the word line WL (the right-left direction in the figure), source regions 700, 702 are formed.

Moreover, in U.S. Pat. No. 6,711,064, FIG. 2 illustrates multiple memory cell regions adjacent to each other. In this example, a floating gate electrode 122 and a selection gate 124 are also formed to extend in a word line direction (the right-left direction in the figure). Further, it is configured such that although electrically connected to each other, separated regions of source lines 142 are each used as source regions in memory cells.

The same also applies to the OTP memory. Moreover, for the MTP memory, a deletion line is further necessary. In US Patent Application Publication No. 2017/0207228, a deletion line is provided on the upper side of a drain region 111, and is set in a line shape having a constant width in the word line direction. In U.S. Pat. No. 6,711,064, a deletion region is, between cells adjacent to each other in the word line direction, provided in a line shape in a direction perpendicular to a word line (a deletion gate electrode 120). As a result, since the deletion region is provided, it is necessary to ensure an area in a line shape. The above-described layout is a cause for increasing the area of the memory cell.

On the other hand, it is generally more advantageous in a cost etc. as the memory cell region becomes smaller.

Thus, the present disclosure describes a semiconductor device such as a NVM with a narrowed area of a memory cell region.

The inventor(s) of the present application has conceived that a component included in an individual memory cell, such as a source region, is shared by multiple memory cell regions. Moreover, for such a configuration, the inventor(s) of the present application has also conceived that a selection gate and a floating gate are provided in a shape extending in a direction with an angle to a word line direction.

Specifically, in a semiconductor device of the present disclosure, first and second memory cells are arranged on a semiconductor substrate. The first memory cell includes, between a first source region and a first drain, a configuration in which a first selection gate and a first floating gate are arranged in series. The second memory cell includes, between a second source region and a second drain, a configuration in which a second selection gate and a second floating gate are arranged in series. The first memory cell and the second memory cell are adjacent to each other in a first direction. A first signal line extending in the first direction and connected to the first selection gate and the second selection gate is further provided. The first source region and the second source region are configured to share a first region. The first selection gate extends in a direction different from the first direction.

Note that the first memory cell may include a first deletion region, and the first floating gate may extend to the first deletion region.

Moreover, third and fourth memory cells configured as in the first and second memory cells and provided adjacent to each other in the first direction may be further provided on the semiconductor substrate. In this case, source regions of the third and fourth memory cells are configured to share a second region. The first region and the second region are different regions. Further, the first memory cell and the third memory cell are adjacent to each other in a second direction different from the first direction.

Further, the first selection gate and the third selection gate may be electrically connected to each other.

According to the semiconductor device of the present disclosure, the source region is shared by the multiple memory cells, and therefore, the area of the device is narrowed.

DETAILED DESCRIPTION

Hereinafter, embodiments of the present disclosure will be described with reference to the drawings.

First Embodiment

Figure 1:
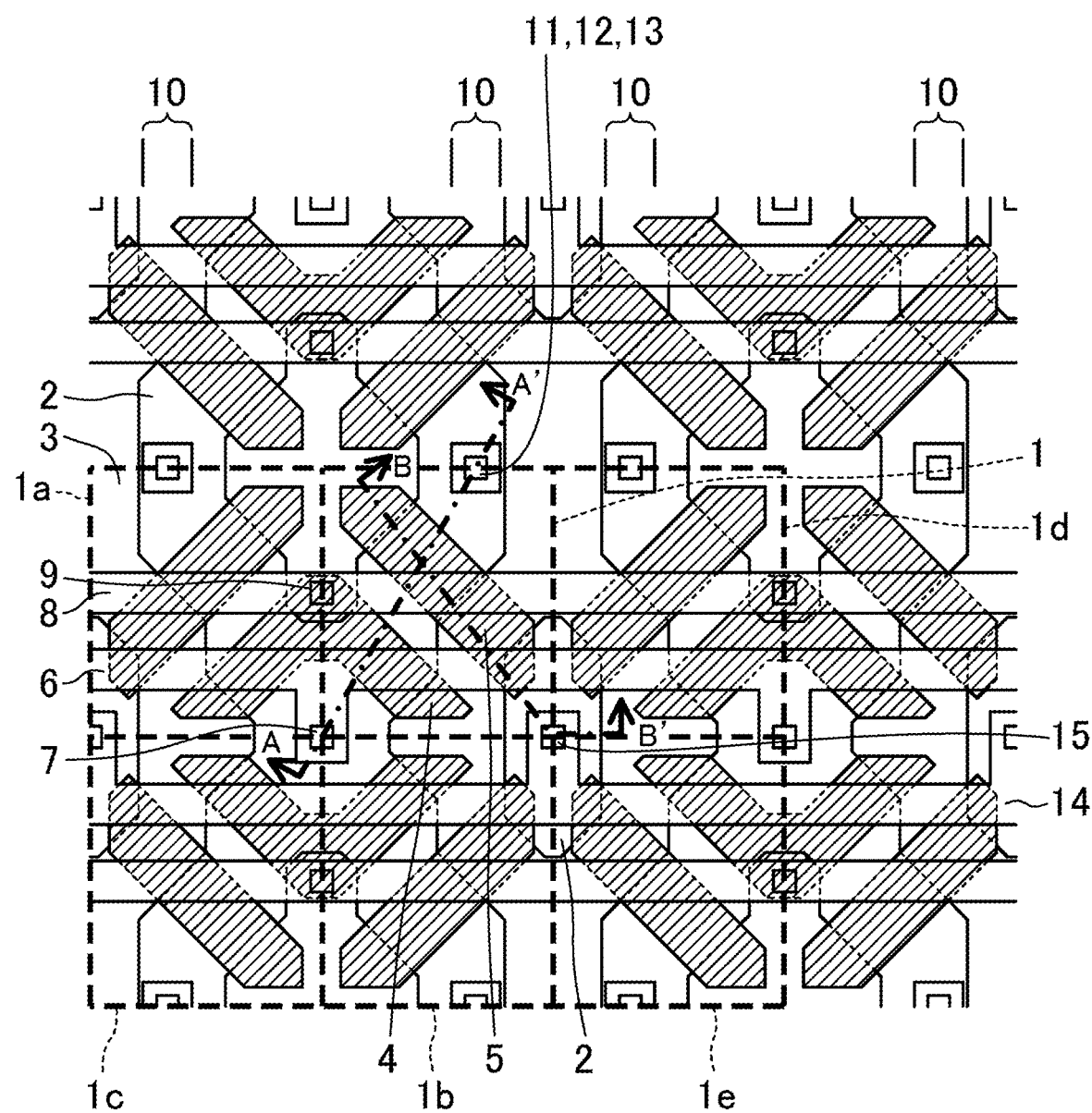
FIG. 1 is a schematic plan view illustrating the configuration of a memory cell in a first embodiment of the present disclosure.
Figure 2:
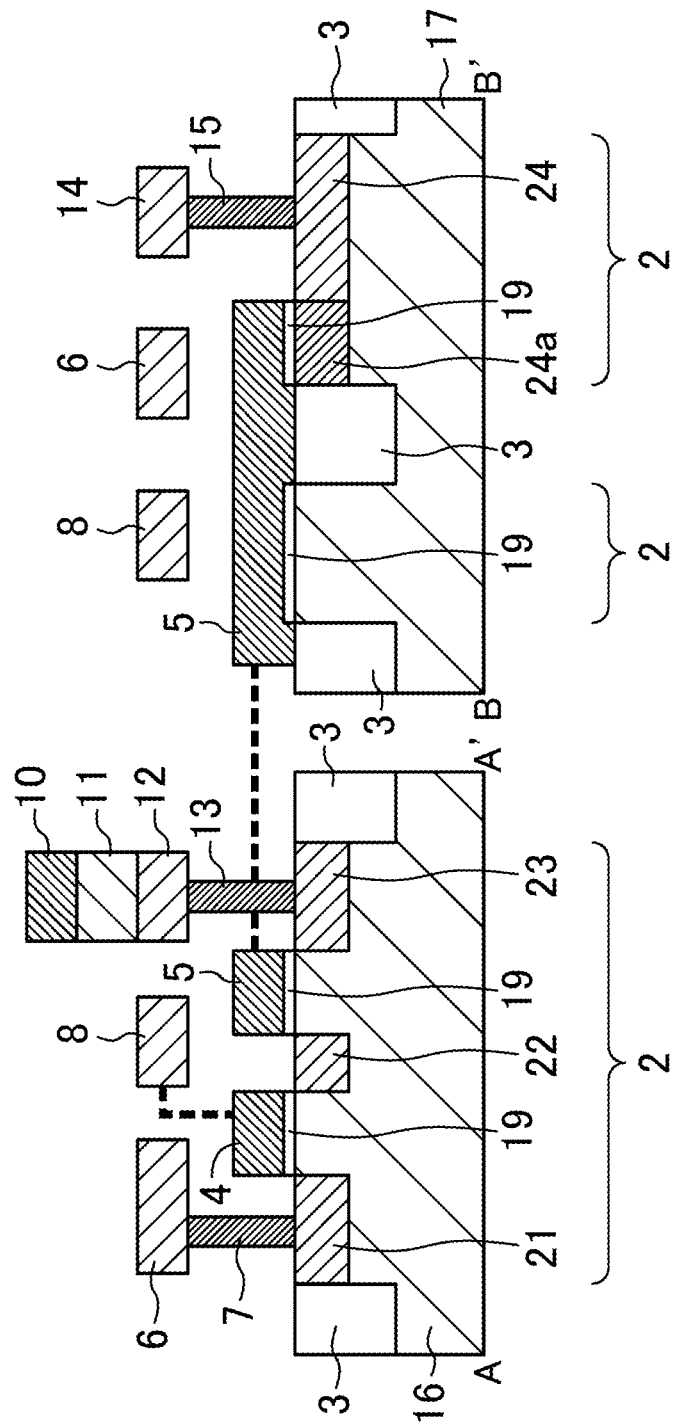
FIG. 2 is a schematic view illustrating sections along an A-A' line and a B-B' line in FIG. 1.

FIG. 1 is a schematic plan view illustrating the layout of a memory cell in a semiconductor memory device of the present embodiment. FIG. 2 is a schematic sectional view illustrating sections along an A-A' line and a B-B' line of FIG. 1.

In FIG. 1, an area surrounded by a dashed rectangle corresponds to one memory cell region 1. As illustrated in FIGS. 1 and 2, the semiconductor memory device has layout with an active region 2 provided on a semiconductor substrate, a selection gate 4 and a floating gate 5 as gate electrodes formed on the semiconductor substrate, and a source signal line 6, a word signal line 8, and a bit line connection portion 12 as a first wiring layer. Moreover, a bit line 10 as a second wiring layer is provided above the first wiring layer. Note that for the sake of simplicity in illustration, FIG. 1 does not show the shape of the bit line 10 and illustrates the width of the bit line by a reference numeral 10 above the drawing. The bit line 10 is, as a line with such a width, formed to extend in the upper-lower direction as viewed in the drawing.

Note that in the present embodiment, it is configured such that the bit line 10 is linearly arranged in a longitudinal direction of the drawing and is connected at a drain portion of each memory cell. However, the bit line 10 may be formed as a meandering line with a narrow wiring width or may be divided, as necessary. The wiring width is narrowed so that a wiring capacity can be reduced, charge/discharge current for a bit line capacity can be reduced, and high-speed operation can be realized, for example.

In a P-type well 16 or a P-type well 17 on the semiconductor substrate, the active region 2 is defined by a separation region 3 and is formed as an N-channel type. The selection gate 4 and the floating gate 5 are formed on the P-type well 16 or the P-type well 17 through a gate insulating film 19.

The section along the A-A' line mainly shows a reading portion and a writing portion. A source region 21 as part of the active region 2 is arranged on the opposite side of the selection gate 4 from the floating gate 5. The source signal line 6 is electrically connected to the source region 21 through a source contact 7. A drain region 23 as part of the active region 2 is arranged on the opposite side of the floating gate 5 from the selection gate 4. The bit line connection portion 12 as part of the first wiring layer is connected to the drain region 23 through a drain contact 13, and the bit line 10 as the second wiring layer is further connected to the drain region 23 through an interlayer contact 11. A diffusion connection region 22 as part of the active region 2 is also arranged between the selection gate 4 and the floating gate 5.

The selection gate 4 is electrically connected to the word signal line 8 through a gate contact 9 illustrated in FIG. 1. This is shown as connection with a dashed line in FIG. 2.

Moreover, a floating gate transistor including the floating gate 5, the diffusion connection region 22, and the drain region 23 may be set on a depression side with respect to a selection gate transistor including the selection gate 4, the source region 21, and the diffusion connection region 22. With this configuration, operation is allowed without over-deletion.

The section along the B-B' line mainly shows a deletion portion. The floating gate 5 extends to a deletion region 24 as part of the active region 2 at the deletion portion (a dashed line connecting floating gates 5A, 5B in both sections indicates electrical connection). A deletion signal line 14 is electrically connected to the deletion region 24 through a deletion contact 15. The deletion region 24 is formed as an N-channel type in the P-type well 17. A gate portion 24a of the deletion region 24 may be set on the depression side so that deletion can be facilitated.

In the layout of the present embodiment, a direction in which the selection gate 4 and the floating gate 5 extend is inclined with respect to the direction of the word signal line 8 as illustrated in FIG. 1. In an example of FIG. 1, such a direction forms an angle of 45° or 135°. With this configuration, the source region can be arranged at a corner of the quadrangular memory cell, and the multiple memory cells can share the source region 21 and the deletion region 24. As a result, the area of the memory cell can be narrowed. Note that the angle is not limited to 45° or 135°, and depending on a design rule, another angle is better employed to narrow the memory cell area in some cases. For example, the angle may be 30° or 150°, or may be other values.

Specifically, one memory cell region 1 surrounded by a dashed line and memory cell regions 1a, 1b, 1c arranged on the left side, the lower side, and the lower left side of the memory cell region 1 in FIG. 1 are taken for example. In other words, four memory cell regions arranged in 2×2 in the direction of the word signal line 8 and the direction of the bit line 10 are taken for example. The memory cell region 1 has such layout that the source region 21 is arranged in the vicinity of the lower left corner. On the other hand, the memory cell regions 1a, 1b, 1c have such layout that the same source region 21 is on the lower right side, the upper left side, and the upper right side. With this configuration, these four memory cell regions can share the source region 21 formed using the same active region as a source region in each memory cell, and the area can be narrowed as compared to layout that source regions 21 are separately provided in individual memory cell regions.

The above-described arrangement is realized in such a manner that adjacent ones of the memory cell regions are symmetric with respect to a boundary therebetween as the axis of symmetry. For example, in the memory cell region 1, the selection gate 4 and the floating gate 5 extend diagonally from the upper left side to the lower right side (in FIG. 1, the same hereinafter), and the floating gate 5 is positioned above the selection gate 4. On the other hand, in the memory cell region 1a adjacent in the direction of the word signal line 8, both gates extend diagonally from the upper right side to the lower left side, and the floating gate 5 is positioned above the selection gate 4. Further, in the memory cell region 1b adjacent in the direction of the bit line 10, both gates extend diagonally from the upper right side to the lower left side, and the selection gate 4 is positioned above the floating gate 5. In the memory cell region 1c, both gates extend diagonally from the upper left side to the lower right side, and the selection gate 4 is positioned above the floating gate 5. As in the above-described form, adjacent ones of the memory cells are symmetric with respect to the boundary therebetween as the axis of symmetry. Note that the source region is arranged with the source region being shifted to one side of the boundary between adjacent ones of the memory cell regions (in the present embodiment, a corner portion of the rectangular memory cell region).

Moreover, in two memory cell regions sharing the source region 21 and provided adjacent to each other in the direction of the word signal line 8, the selection gates 4 are connected to each other to form an integrated gate extending across both regions. The direction in which the selection gate 4 extends is different between these two memory cells, and therefore, the integrated gate is in a shape bent in an L-shape.

Further, the memory cell region 1 has such layout that the deletion region 24 formed using the active region 2 is arranged in the vicinity of the lower right corner. On the other hand, in the memory cell region 1b, the deletion region 24 is arranged on the upper right side. Further, on the right side of the memory cell regions 1, 1b as viewed in the figure, memory cell regions 1d, 1e having the deletion region 24 on the lower left side and the upper left side are provided. Thus, four memory cell regions including the memory cell regions 1, 1a but different from the above-described four memory cell regions sharing the source region 21 share the same deletion region 24. With this configuration, the area is also narrowed.

In addition, two memory cell regions including the memory cell region 1 and the memory cell region (the area is not shown) above the memory cell region 1 share the drain region 23. That is, two memory cells adjacent to each other in a direction crossing the source signal line 6 share one drain region 23. This point also contributes to area narrowing.

Note that the MTP configuration including the deletion portion has been described herein, but the present disclosure is not limited to such a configuration. In other types of memory devices such as an OTP memory including no deletion portion, a source region 21 and a drain region 23 can be shared for area narrowing.

Note that the layout that the multiple memory cells share the drain portion as described in the present embodiment is useful in terms of area narrowing, but is not essential. It may be configured such that drain portions are each arranged in memory cells without sharing of the drain portion.

(Operation of Memory Device)

In one example of reading operation, the selection gate 4 is selected (i.e., gate voltage is applied), and ON or OFF of the floating gate transistor is determined. In this manner, 0 or 1 is read.

In writing operation, the selection gate 4 is selected, and current is applied. In this manner, charge is applied to the floating gate 5 by a hot carrier, thereby changing the state of the floating gate transistor.

In deletion operation, high voltage is applied to the deletion region 24. In this manner, charge is drawn from the floating gate 5 by Fowler-Nordheim (FN) current, resetting the memory cell. At this point, the multiple memory cells sharing the deletion region 24 are simultaneously deleted. Note that as necessary, the deletion regions of the multiple memory cells may be electrically separated from each other.

Note that in the case of the OTP memory including no deletion portion, deletion operation utilizing ultraviolet light (UV) can be utilized.

Second Embodiment

Figure 3:
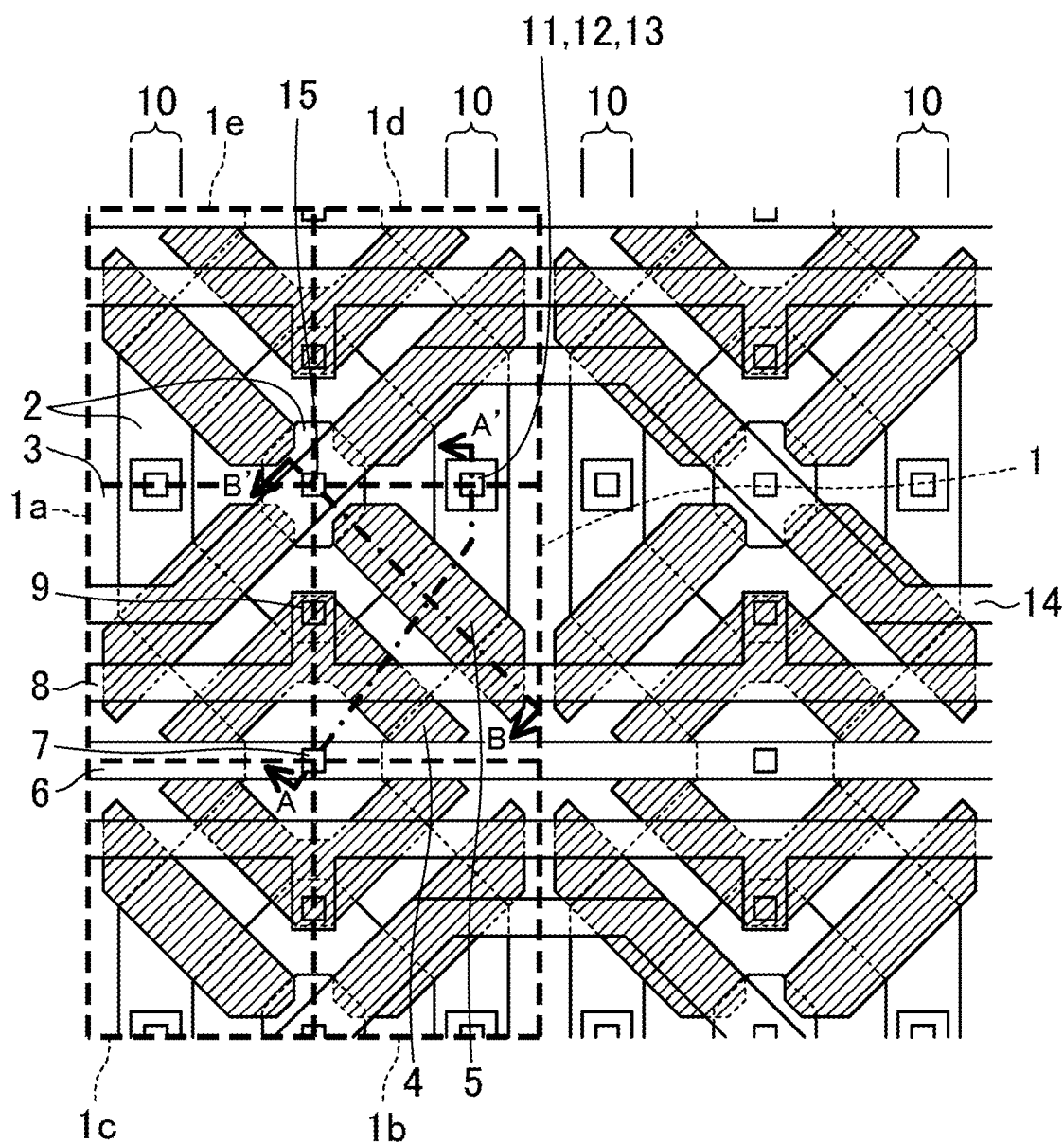
FIG. 3 is a schematic plan view illustrating the configuration of a memory cell in a second embodiment of the present disclosure.
Figure 4:
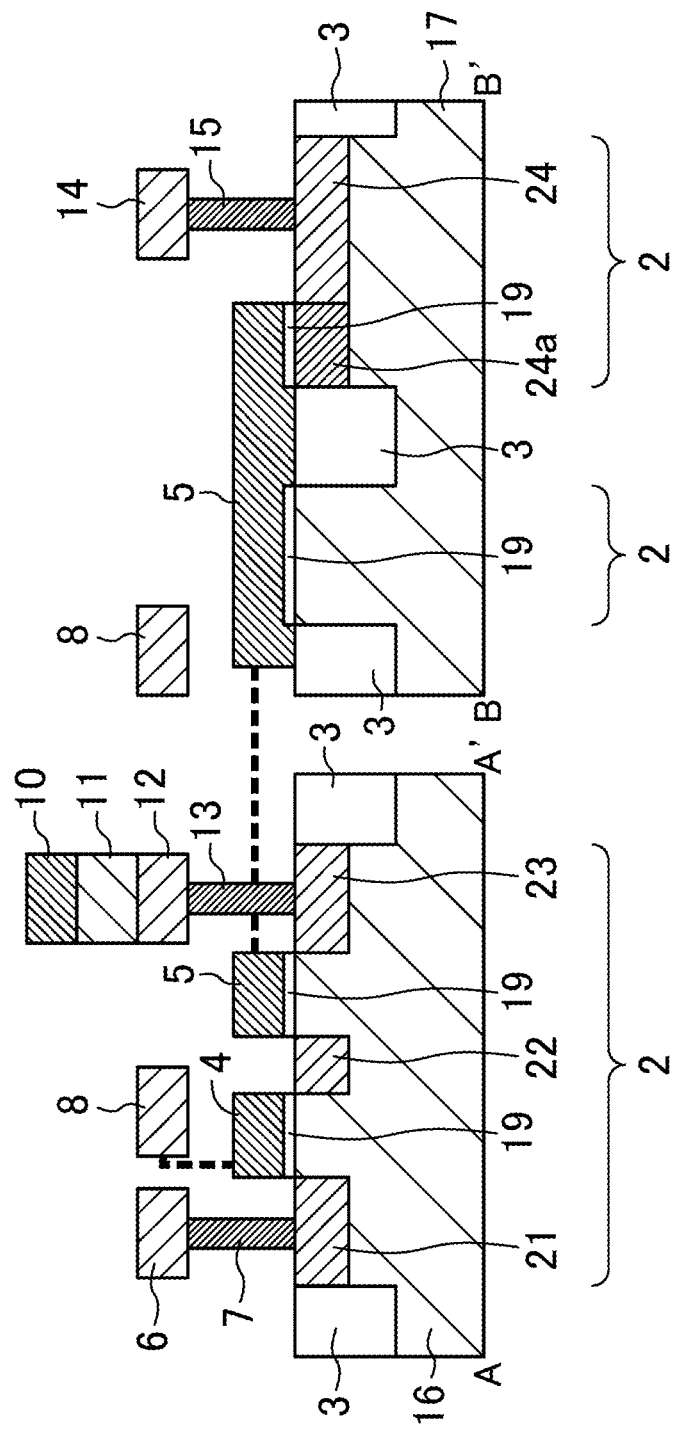
FIG. 4 is a schematic view illustrating sections along an A-A' line and a B-B' line in FIG. 3.

Next, a semiconductor memory device of a second embodiment will be described. FIG. 3 is a schematic plan view illustrating the layout of a memory cell in the semiconductor memory device of the present embodiment. FIG. 4 is a schematic sectional view illustrating sections along an A-A' line and a B-B' line of FIG. 3.

In FIGS. 3 and 4, basic components are similar to those of FIGS. 1 and 2 of the first embodiment, and the same reference numerals are used to represent equivalent components. Note that the width of a bit line is merely shown above the drawing.

In the present embodiment, four memory cell regions also share a source region 21. Specifically, in the present embodiment, memory cell regions 1, 1a, 1b, 1c also share the same source region 21 positioned at the center of these regions. With this configuration, the area of the semiconductor memory device is narrowed.

Moreover, four memory cell regions also share a deletion portion injection region 23. Specifically, four memory cell regions including the memory cell regions 1, 1a and memory cell regions 1d, 1e adjacent to the upper side of the memory cell regions 1, 1a in FIG. 3 share one deletion portion injection region 23 positioned at the center of these regions. With this configuration, the area of the semiconductor memory device is also narrowed.

The present embodiment is different from the first embodiment in arrangement of a deletion portion.

In the first embodiment, the memory cell region 1 having the source region 21 on the lower left side in FIG. 1 has the deletion portion injection region 23 on the lower right side. Due to such arrangement, the source region 21 shared by four memory cell regions (e.g., the memory cell regions 1, 1a, 1b, 1c) and the deletion portion injection region 23 shared by other four memory cell regions (e.g., the memory cell regions 1, 1b, 1d, 1e) are arranged in the direction of the source signal line 6 and the word signal line 8 (the right-left direction in FIG. 1).

On the other hand, in the present embodiment, the source region 21 shared by four memory cell regions (e.g., the memory cell regions 1, 1a, 1b, 1c) and the deletion portion injection region 23 shared by four memory cell regions (e.g., the memory cell regions 1, 1b, 1d, 1e) are arranged in the direction of a bit line 10 (the upper-lower direction in FIG. 3).

In the present embodiment, the multiple memory cell regions also share, e.g., the source region 21 and the deletion portion injection region 23, and therefore, the effect of narrowing the area of the semiconductor memory device is provided. Moreover, operation of the memory cell is similar to that of the first embodiment.

Further, depending on, e.g., a design rule, the area can be, in some cases, more narrowed in the layout of the present embodiment than in the layout of the first embodiment.

Third Embodiment

Figure 5:
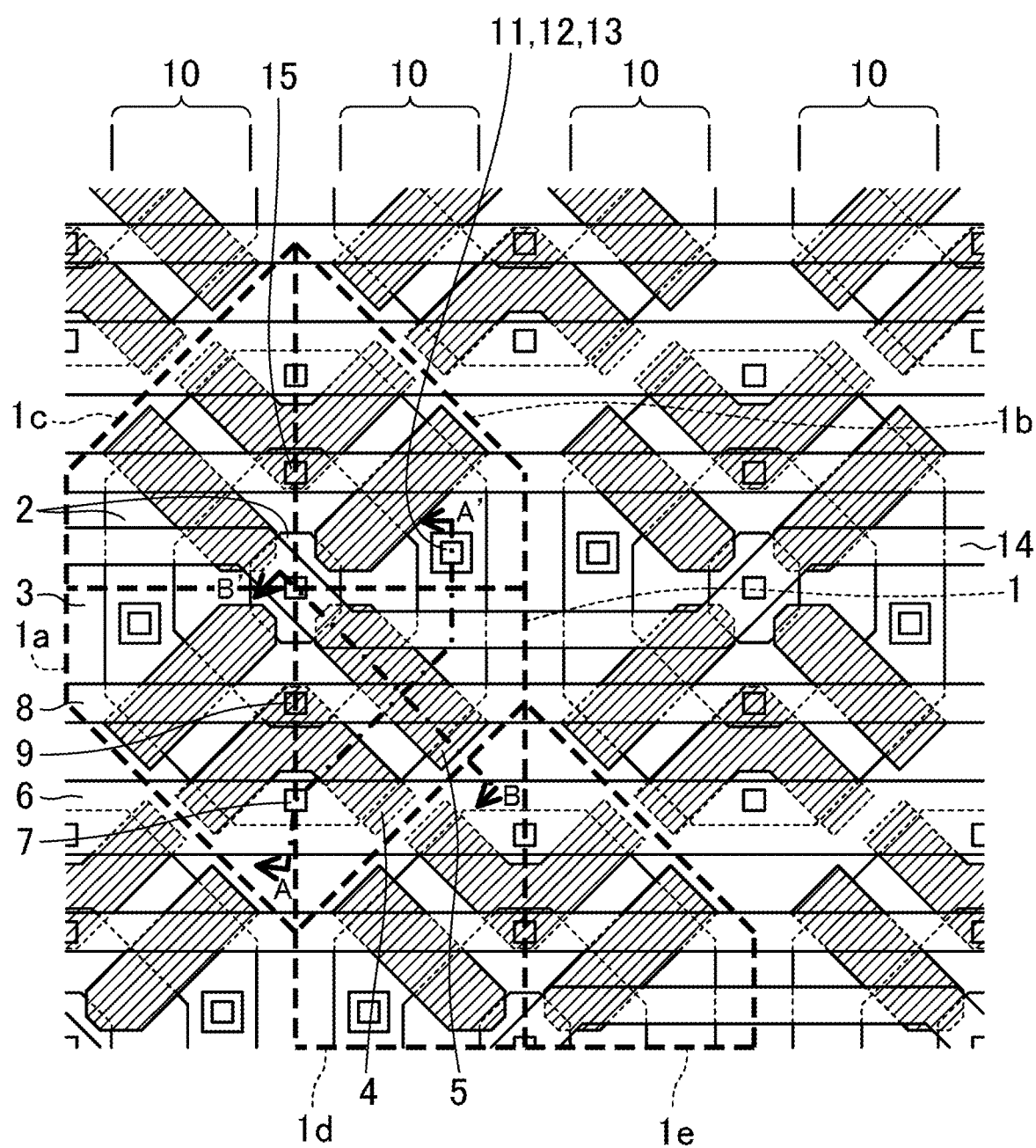
FIG. 5 is a schematic plan view illustrating the configuration of a memory cell in a third embodiment of the present disclosure.
Figure 6:
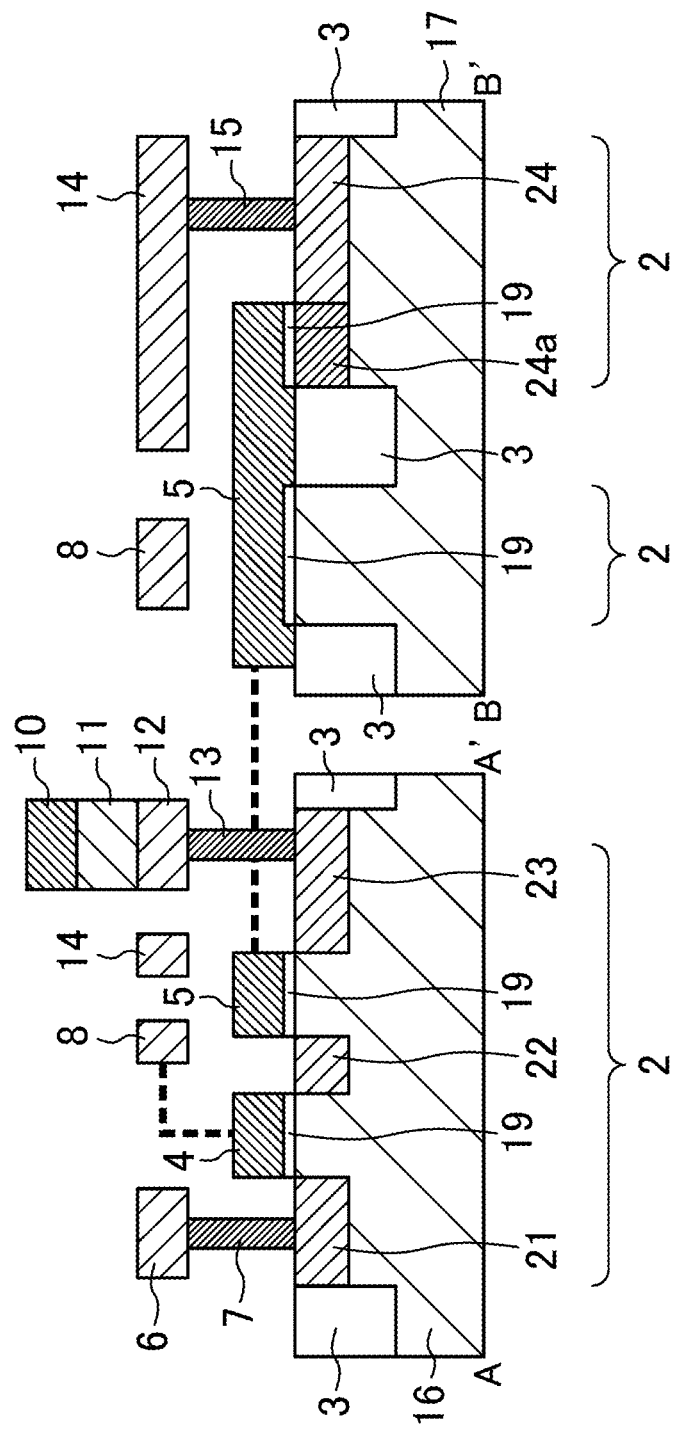
FIG. 6 is a schematic view illustrating sections along an A-A' line and a B-B' line in FIG. 5.

Next, a semiconductor memory device of a third embodiment will be described. FIG. 5 is a schematic plan view illustrating the layout of a memory cell in the semiconductor memory device of the present embodiment. FIG. 6 is a schematic sectional view illustrating sections along an A-A' line and a B-B' line of FIG. 5.

In FIGS. 5 and 6, basic components are similar to those of FIGS. 1 and 2 of the first embodiment, and the same reference numerals are used to represent equivalent components. Note that the width of a bit line 10 is merely shown above the drawing. As illustrated in FIG. 5, the width of the bit line 10 is broader than that in the case of the first embodiment. This is because in the present embodiment, the position of a drain contact 13 in memory cell regions adjacent to each other in the direction of the bit line 10 is shifted in the direction of a word signal line 8.

In the first embodiment, the memory cell region is in the rectangular shape. On the other hand, in the present embodiment, a memory cell region 1 is in such a trapezoidal shape that a boundary between the memory cell regions arranged in the direction of the bit line 10 is inclined. Note that such a memory cell region shape is merely a shape surrounding a region including a set of components for descriptive purposes. Thus, instead of the inclined border, various shapes such as a thick L-shaped stepped region may be employed.

Moreover, one memory cell region 1 and a memory cell region 1a adjacent to the memory cell region 1 in the direction of the word signal line 8 share a source region 21. With this configuration, the area of the semiconductor memory device is narrowed. However, unlike the first embodiment, the memory cell regions arranged along the bit line 10 do not share the source region 21. Two memory cell regions arranged in the direction of the bit line 10 share a drain region 23 (e.g., the memory cell region 1 and a memory cell region 1b).

Further, a memory cell region 1d adjacent to the memory cell region 1 in the direction of the bit line 10 with respect to the inclined border and a memory cell region 1e adjacent to the memory cell region 1d in the direction of the word signal line 8 share a source region 21. The source region 21 shared by the memory cell regions 1, 1a and the source region 21 shared by the memory cell regions 1d, 1e are different regions, and are connected to the same source signal line 6. These two source regions 21 correspond to different word signal lines 8.

In addition, the memory cell regions 1, 1a share a deletion portion injection region 23. Moreover, the memory cell regions 1b, 1c adjacent to the memory cell regions 1, 1a in the direction of the bit line 10 also share the same deletion portion injection region 23.

Supposing that four memory cell regions sharing the deletion portion injection region 23 form one unit (a hexagonal shape in FIG. 5, and one unit may be in an octagon shape depending on arrangement of each memory cell region), these units are arranged with the units being alternately shifted from each other by half. That is, when the memory cell regions 1, 1a, 1b, 1c are taken as one unit, one memory cell region unit (four memory cell regions) is, as viewed in the direction of the bit line 10, arranged at a position shifted such that the units overlap with each other by the half of one unit (i.e., an amount corresponding to one memory cell region).

With such arrangement, the area of the semiconductor memory device can be further decreased depending on, e.g., a design rule.

Note that the present embodiment is configured such that the word signal lines 8 of the memory cells arranged with the memory cells being alternately shifted from each other by half are different word signal lines 8, but these lines may be the electrically-same word signal line 8. In this case, the memory cells simultaneously selected by the same word signal line 8 need to be connected to different bit lines 10. If it is configured such that connection to different bit lines is made as described above, the memory cells connected to one bit line are reduced, and therefore, high-speed operation and low power consumption can be realized.

Note that a MTP memory having a deletion portion has been described herein, but an OPT memory including no deletion portion can be employed. In this case, four memory cell regions can be also taken as one unit. For example, memory cell regions 1, 1a, 1b, 1c share a source region 21 or a drain region 23.

The present embodiment is similar to the first embodiment in that a selection gate 4 and a floating gate 5 extend diagonally with respect to the direction of the word signal line 8 and adjacent ones of the memory cell regions are symmetric with respect to a line, for example.

Fourth Embodiment

Figure 7:
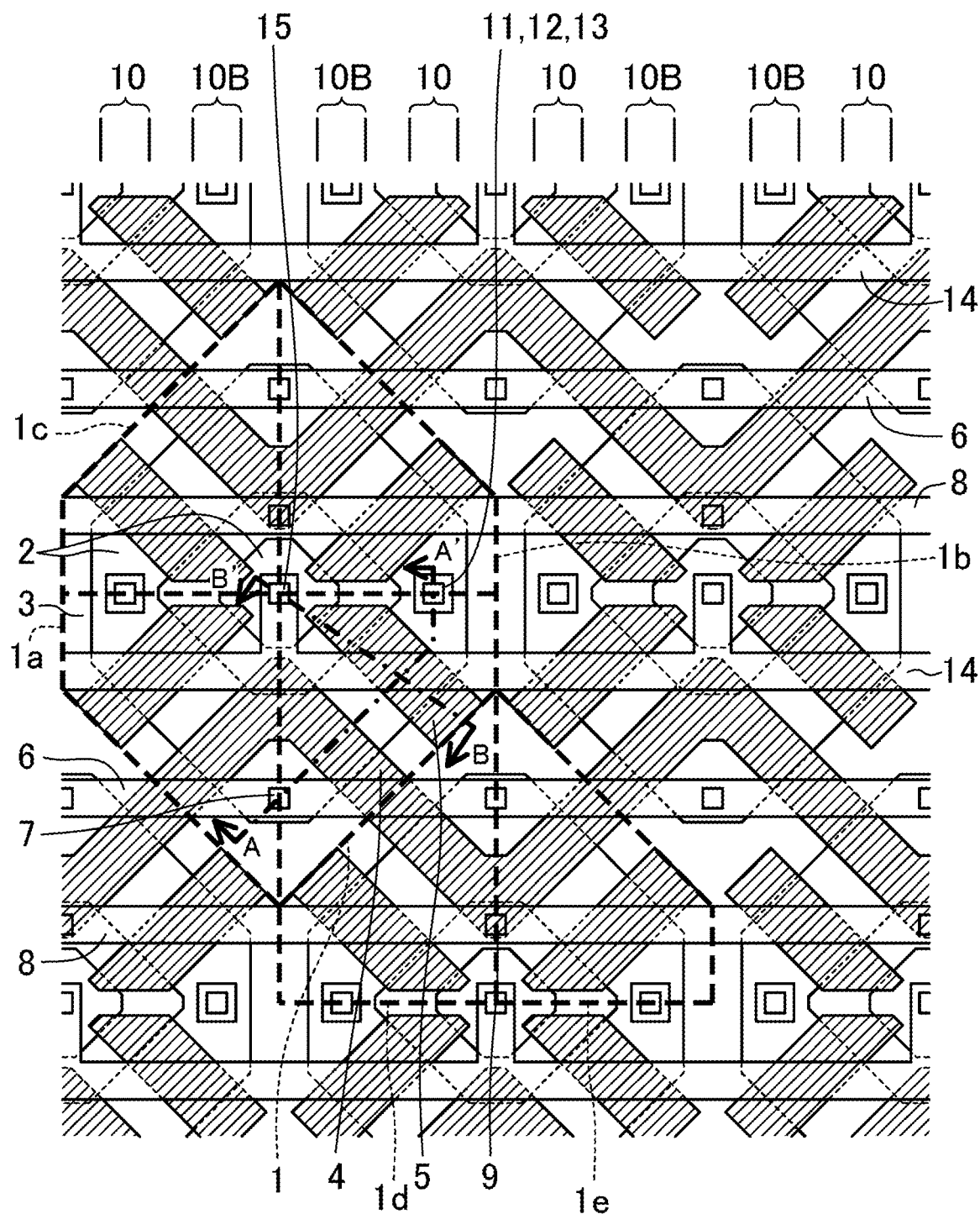
FIG. 7 is a schematic plan view illustrating the configuration of a memory cell in a fourth embodiment of the present disclosure.
Figure 8:
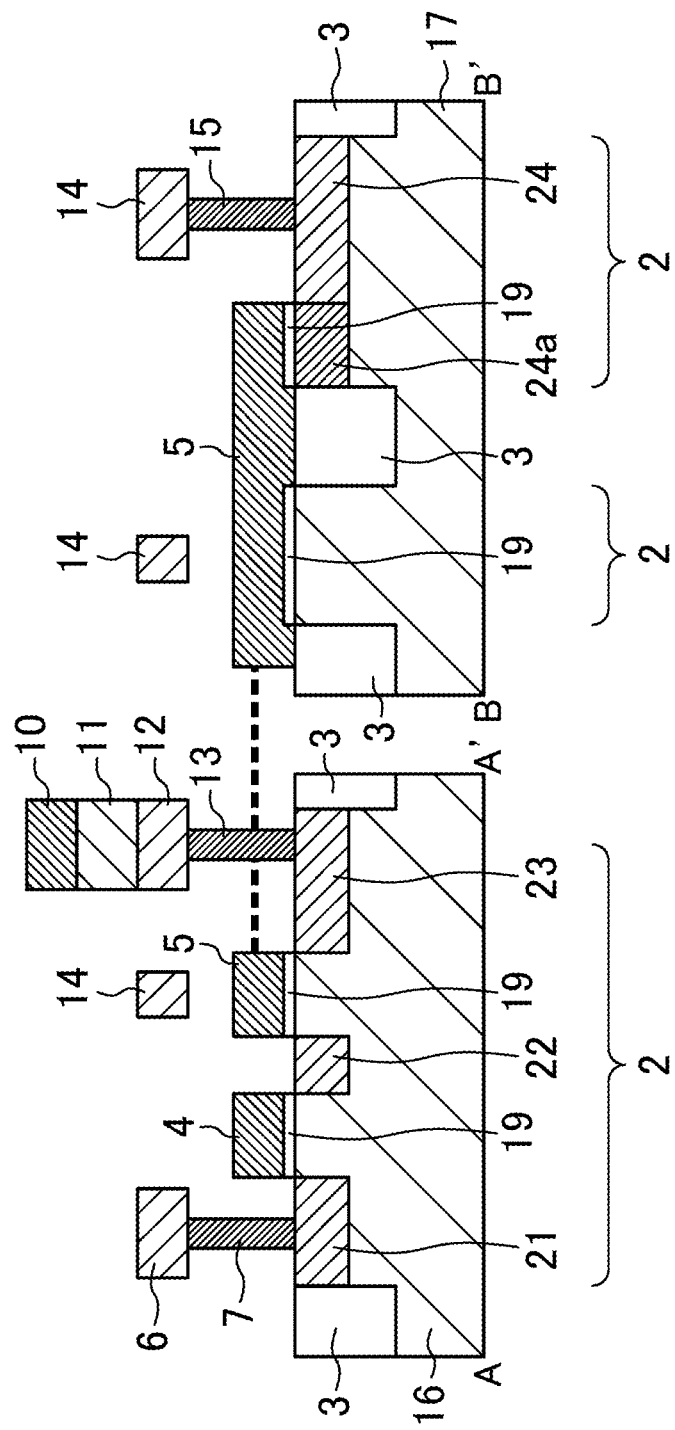
FIG. 8 is a schematic view illustrating sections along an A-A' line and a B-B' line in FIG. 7.

Next, a semiconductor memory device of a fourth embodiment will be described. FIG. 7 is a schematic plan view illustrating the layout of a memory cell in the semiconductor memory device of the present embodiment. FIG. 8 is a schematic sectional view illustrating sections along an A-A' line and a B-B' line of FIG. 7.

In FIGS. 7 and 8, a basic configuration is similar to that of FIGS. 5 and 6 of the third embodiment, and the same reference numerals are used to represent equivalent components.

In the present embodiment, a selection gate 4 is continuously formed in the direction of a word signal line 8. First, as in the third embodiment, the selection gate 4 is continuously integrally formed in two memory cell regions (e.g., memory cell regions 1, 1a) sharing a source region 21. Further, in the case of the present embodiment, the selection gate 4 is also continuously formed between memory cell regions not sharing the source region 21. For example, the selection gate 4 is also continuously formed in the memory cell region 1 and a memory cell region 1d adjacent to the memory cell region 1 in the direction of a bit line 10 with respect to an inclined border. As a result, the selection gate 4 continuously extends, as a whole, in the direction of the word signal line 8 while bending to change its direction.

With this configuration, the selection gates 4 of two memory cell regions (e.g., 1 and 1d) arranged in the direction of the bit line 10 are electrically connected to each other, and therefore, the same word signal line 8 can be used. Thus, the number of word signal lines 8 can be reduced to half as compared to the case of the third embodiment (FIG. 5). Thus, there is room for drawing of a first wiring layer forming the word signal line 8, and therefore, laying out can be facilitated and the memory cell region can be further narrowed.

Note that the number of bit lines needs to be doubled due to reduction in the number of word signal lines 8 to half. That is, in the case of the third embodiment (FIG. 5), the same bit line 10 is used for the memory cell regions 1, 1d, and two word signal lines 8 each correspond to the memory cell regions. On the other hand, in the present embodiment, one word signal line 8 is used for the memory cell regions 1, 1d, and therefore, a bit line 10B (as in the bit line 10, only a width is shown on the upper side in FIG. 7) needs to be used in addition to the bit line 10. Thus, the density of a second wiring layer forming the bit line 10 is increased, but formation is facilitated due to a simple shape. Moreover, it is preferable because the degree of freedom in design including multiple layers is increased.

Moreover, the selection gate 4 is continuously formed across the multiple memory cell regions, and therefore, the memory cell region can be more narrowed as compared to the case of separating selection gates 4.

Note that in the present embodiment, four memory cell regions (e.g., the memory cell regions 1, 1a, 1b, 1c) also share a deletion portion injection region 23.

Fifth Embodiment

Figure 9:
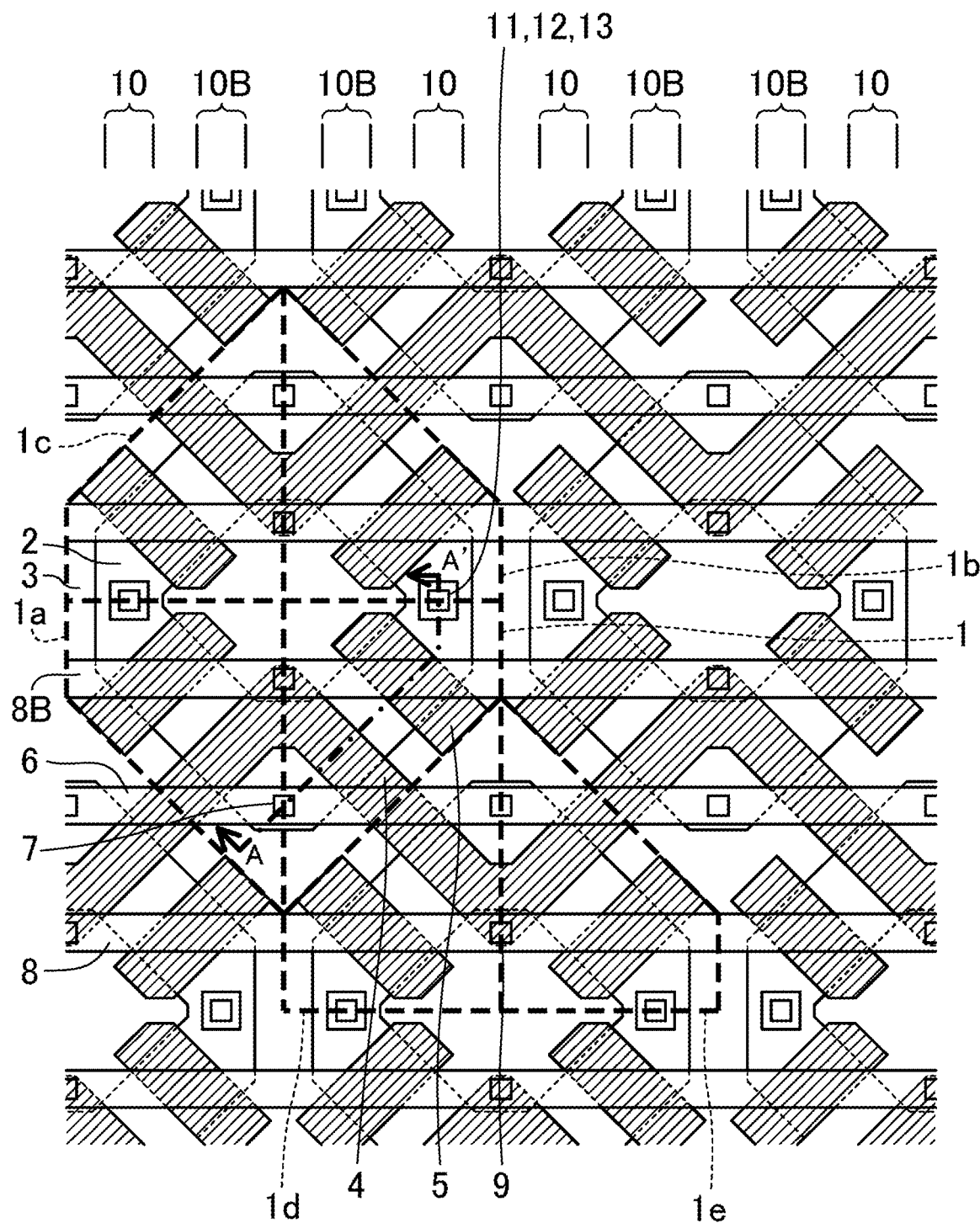
FIG. 9 is a schematic plan view illustrating the configuration of a memory cell in a fifth embodiment of the present disclosure.
Figure 10:
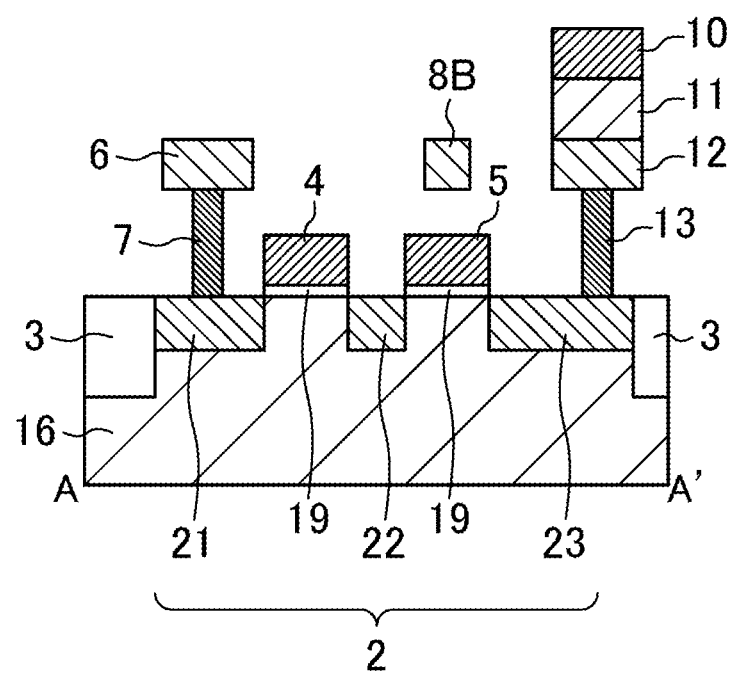
FIG. 10 is a schematic view illustrating a section along an A-A' line in FIG. 9.

Next, a semiconductor memory device of a fifth embodiment will be described. FIG. 9 is a schematic plan view illustrating the layout of a memory cell in the semiconductor memory device of the present embodiment. FIG. 10 is a schematic sectional view illustrating sections along an A-A' line and a B-B' line of FIG. 9.

In FIGS. 9 and 10, a basic configuration is similar to that of FIGS. 7 and 8 of the fourth embodiment, and the same reference numerals are used to represent equivalent components.

The present embodiment is different from the fourth embodiment in that no deletion portion injection region 23 is provided. That is, the semiconductor memory device of the present embodiment is an OTP memory.

This embodiment has such layout that the deletion portion injection region 23 is omitted from the fourth embodiment as the MTP memory and a portion of the floating gate 5 extending to the deletion portion injection region 23 is also omitted. However, due to such omission, layout design can be more optimized, and a memory cell region can be further narrowed.

In the semiconductor memory device of the present embodiment as the OTP memory, e.g., deletion with UV is allowed as deletion operation (reset operation).

Sixth Embodiment

Figure 11:
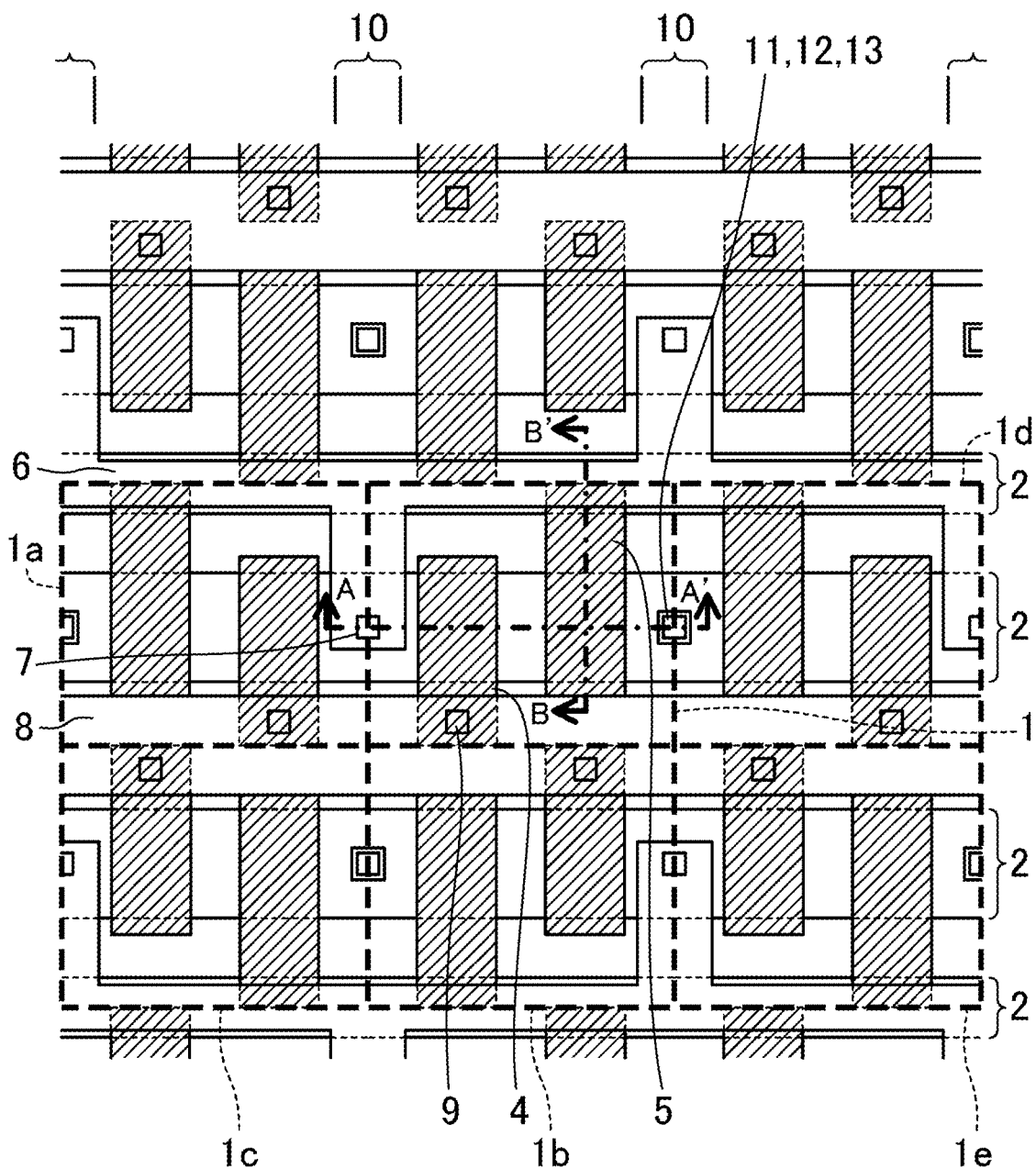
FIG. 11 is a schematic plan view illustrating the configuration of a memory cell in a sixth embodiment of the present disclosure.
Figure 12:
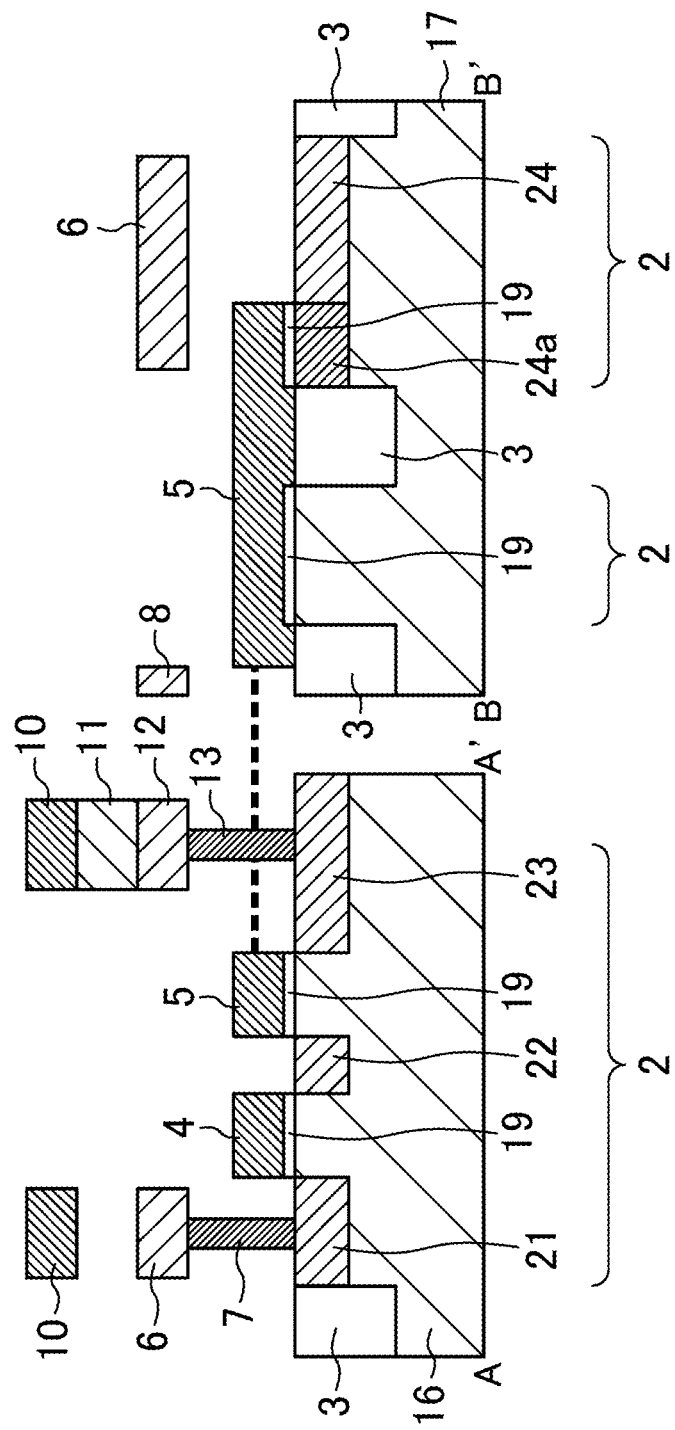
FIG. 12 is a schematic view illustrating sections along an A-A' line and a B-B' line in FIG. 11.

Next, a semiconductor memory device of a sixth embodiment will be described. FIG. 11 is a schematic plan view illustrating the layout of a memory cell in the semiconductor memory device of the present embodiment. FIG. 12 is a schematic sectional view illustrating sections along an A-A' line and a B-B' line of FIG. 11.

In the embodiments described so far, it is configured such that the selection gate 4, the floating gate 5, etc. are provided to extend diagonally (e.g., 45° or 135°) with respect to the direction of the word signal line 8. On the other hand, in the present embodiment, a selection gate 4 and a floating gate 5 are provided to extend in a direction of 90° with respect to the direction of a word signal line 8.

In the present embodiment, in a memory cell region 1, a source region 21 is arranged at the left end, the selection gate 4 and the floating gate 5 are arranged in this order toward the right side, and a drain region 23 is arranged at the right end (see FIG. 12), as viewed in FIG. 11. Moreover, in a memory cell region 1a on the left side of the memory cell region 1, the source region 21 is arranged at the right end, and the selection gate 4, the floating gate 5, and the drain region 23 are arranged in this order toward the left side. With this configuration, the memory cell regions 1, 1a share the source region 21, and the area of the semiconductor memory device can be narrowed.

Note that the selection gates 4 of the memory cell regions 1, 1a are connected to the word signal line 8 positioned on the lower side in FIG. 11 through gate contacts 9, and are connected to a source signal line 6 positioned on the upper side through source contacts 7.

Next, a memory cell region 1b on the lower side of the memory cell region 1 has such a configuration that the source region 21 is at the right end as in the memory cell region 1a. Further, a memory cell region 1 on the right side of the memory cell region 1b has such a configuration that the source region 21 is at the left end as in the memory cell region 1. Thus, these two memory cell regions 1b, 1e also share the source region 21, and the area of the semiconductor memory device can be narrowed.

Note that the selection gates 4 of the memory cell regions 1b, 1e are connected to the word signal line 8 on the upper side in FIG. 11 through the gate contacts 9, and are connected to the source signal line 6 positioned on the lower side through the source contacts 7.

Further, a memory cell region 1d on the right side of the memory cell region 1 has the same layout as that of the memory cell region 1a, and although outside of the area of the figure, the memory cell region 1d and a memory cell region on the further right side share the source region. Similarly, a memory cell region 1c on the left side of the memory cell region 1b has the same layout of the memory cell region 1e, and the memory cell region 1c and a memory cell region on the further left side share the source region.

As described above, a pair of memory cell regions arranged in the direction of the word signal line 8 share the source region. In rows adjacent to each other in the direction of a bit line 10, a pair of memory cells sharing the source region is in such arrangement that the memory cells are shifted from each other in the direction of the word signal line 8 by an amount corresponding to one memory cell. Moreover, each word signal line 8 and each source signal line 6 correspond to two rows of the memory cell regions.

As described above, in the case of the present embodiment, the multiple memory cell regions also share, e.g., the source region, the drain region, and a deletion portion, and the area of the memory cell (the semiconductor memory device) can be narrowed.

Note that the gate contact 9 from the word signal line 8 to the selection gate 4 is, in description above, arranged in a non-active region, but can be arranged in the active region. With this configuration, the area of the memory cell can be further narrowed.

The semiconductor device of the present disclosure is configured so that the area of the layout can be narrowed, and therefore, is useful as a semiconductor device for a higher-density memory device.

What is claimed is:

1. A semiconductor device comprising:
   first and second memory cells arranged on a semiconductor substrate,
   wherein the first memory cell includes, between a first source region and a first drain, a configuration in which a first selection gate and a first floating gate are arranged in series adjacent to each other in a direction parallel to a surface of the semiconductor substrate and without overlapping each other in a direction perpendicular to the surface,
   the second memory cell includes, between a second source region and a second drain, a configuration in which a second selection gate and a second floating gate are arranged in series adjacent to each other in the direction parallel to the surface of the semiconductor substrate and without overlapping each other in a direction perpendicular to the surface, the first memory cell and the second memory cell are adjacent to each other in a first direction, a first signal line extending in the first direction and connected to the first selection gate and the second selection gate is further provided, the first source region and the second source region are configured to share a first region, and the first selection gate extends in a direction different from the first direction.

2. The semiconductor device according to claim 1, wherein:

the first memory cell further includes a first deletion region that does not include the first source region and the first drain region, and the first floating gate extends to the first deletion region.

3. The semiconductor device according to claim 1, wherein the first selection gate and the second selection gate are arranged in such orientation that the first selection gate and the second selection gate are symmetric with respect to an axis of symmetry, the axis of symmetry being a boundary between the first memory cell and the second memory cell.

4. The semiconductor device according to claim 1, wherein another memory cell adjacent to the first memory cell in a direction different from the first direction is further provided, the another memory cell has, between another source region and another drain, a configuration in which another selection gate and another floating gate are arranged in series, and the first source region and the another source region are formed to share the first region.

5. The semiconductor device according to claim 1, further comprising:

third and fourth memory cells arranged on the semiconductor substrate, wherein the third memory cell includes, between a third source region and a third drain, a configuration in which a third selection gate and a third floating gate are arranged in series, the fourth memory cell includes, between a fourth source region and a fourth drain, a configuration in which a fourth selection gate and a fourth floating gate are arranged in series, the third memory cell and the fourth memory cell are adjacent to each other in the first direction, a second signal line extending in the first direction and connected to the third selection gate and the fourth selection gate is further provided, the third source region and the fourth source region are configured to share a second region, the first region and the second region are different regions, and the first memory cell and the third memory cell are adjacent to each other in the second direction different from the first direction.

6. The semiconductor device according to claim 5, further comprising:

a third signal line extending in the first direction and connected to the first region and the second region.

7. The semiconductor device according to claim 5, wherein the first selection gate and the third selection gate are electrically connected to each other.

8. The semiconductor device according to claim 1, wherein a diffusion connection region is provided each of between the first selection gate and the first floating gate and between the second selection gate and the second floating gate.

* * * * *